(12) United States Patent
Holz

(10) Patent No.: US 6,192,144 B1
(45) Date of Patent: Feb. 20, 2001

(54) MR METHOD FOR THE IMAGE-ASSISTED MONITORING OF THE DISPLACEMENT OF AN OBJECT, AND MR DEVICE FOR CARRY OUT THE METHOD

(75) Inventor: Dietrich J. K. Holz, Henstedt-Ulzburg (DE)

(73) Assignee: U.S. Philips Corporation, New York, NY (US)

( * ) Notice: Under 35 U.S.C. 154(b), the term of this patent shall be extended for 0 days.

(21) Appl. No.: 09/004,251

(22) Filed: Jan. 8, 1998

(30) Foreign Application Priority Data

Jan. 15, 1997 (DE) ................................. 197 01 036

(51) Int. Cl.$^7$ ...................................... G06K 9/00
(52) U.S. Cl. ................................................ 382/131
(58) Field of Search ......................... 324/308, 309; 382/128, 130, 131; 600/410, 416, 418, 420, 424; 128/922

(56) References Cited

U.S. PATENT DOCUMENTS

| | | | |
|---|---|---|---|
| 4,858,128 | * | 8/1989 | Nowak .............................. 382/131 |
| 5,323,110 | * | 6/1994 | Fielden et al. ..................... 324/309 |
| 5,337,231 | * | 8/1994 | Nowak et al. ..................... 600/425 |
| 5,539,312 | * | 7/1996 | Fu et al. ............................. 324/309 |
| 5,810,728 | * | 9/1998 | Kuhn .................................. 600/410 |
| 5,836,440 | * | 11/1998 | Liou et al. ......................... 600/431 |

OTHER PUBLICATIONS

"Tracking and Monitoring the Effects of Interventional MR Instruments" G. McKinnon, Proceedings of $3^{rd}$ SMR, p. 490.

M. Kouwenhoven et al, "Current MR Angiography Imaging Techniques, a Survey" In the Book "Vascular Diagnostics", Edited by P. Lanser and J. Rosch, Springer Verlag, Heidelberg 1994, pp. 379–387.

* cited by examiner

Primary Examiner—Joseph Mancuso
Assistant Examiner—F. E. Cooperrider
(74) Attorney, Agent, or Firm—John F. Vodopia

(57) ABSTRACT

An image-assisted monitoring of the displacement of an object, for example a catheter, relative to a vascular system, is enable in which the position of the object is continuously measured and reproduced in an MR angiogram. Shifts/deformations occurring in the course of an examination are determined by obtaining slice images which are compared with images of the same slice which are derived from an original data set. The MR angiogram and/or the position are corrected accordingly.

8 Claims, 3 Drawing Sheets

MR METHOD FOR THE IMAGE-ASSISTED MONITORING OF THE DISPLACEMENT OF AN OBJECT, AND MR DEVICE FOR CARRY OUT THE METHOD

BACKGROUND OF THE INVENTION

1. Field of the Invention

The invention relates to an MR method for the image-assisted monitoring of the displacement of an object relative to a vascular system, in which a first MR data set is acquired which represents the course of the vascular system within a three-dimensional volume, after which the position of the object is continuously measured and reproduced in an MR angiogram derived from the first MR data set.

2. Description of Related Art

An MR method of this kind is known from Proceedings of 3rd SMR, 490, 1995. A comparatively long period of time (from 8 to 20 minutes) is required for the acquisition of an MR data set. Therefore, this MR data set is acquired before introduction of the object, for example a catheter, into the vascular system. After introduction of the catheter, the position of the object is continuously measured in real time and is reproduced in an MR angiogram derived from the first MR data set.

The known method meets its limits when the patient moves during the intervention. The real-time measured position of the object can then no longer be reproduced at the correct location in the angiogram, because the motion of the patient has not been taken up in the angiogram.

SUMMARY OF THE INVENTION

Therefore, it is an object of the invention to improve a method of the kind set forth in such a manner that the position of the object relative to the vascular system is also correctly reproduced in the case of motion of the patient.

This object is achieved according to the invention by executing the following steps:

a) acquisition of the MR data of a slice which belongs at least partly to the volume and is adapted to the position of the object, said acquisition taking place in the temporal vicinity of a measurement of the position of the object, b) reconstruction of a slice image from this MR data, c) reconstruction of an MR image of the same slice from the first data set or from a second MR data set which has been acquired in the temporal vicinity thereof and represents the three-dimensional volume, d) determination of shifts, at least in the vicinity of the object, from the slice image and the MR image, e) correction of the measured position and/or the MR angiogram in conformity with the shifts and subsequent reproduction of the position of the object in the angiogram, f) repetition of the steps a) to e) for other positions of the object.

The invention is based on the consideration that, using the slice image acquired quasi in real time, the motion can be quantitatively determined by comparing this slice image with an MR image of the same slice which is derived from the first data set or from a second data set which has been acquired substantially simultaneously with the first data set. The motion-induced shift of the object between the acquisition of the first or the second MR data set on the one side and the acquisition of the MR data for the relevant slice image on the other side can be derived from this comparison. Therefore, the position thereof in the MR angiogram, or the MR angiogram itself, can be corrected so that the object is reproduced in the correct position relative to the vascular system, despite the motion.

When the sequences with which the first MR data set is acquired deviate substantially from the sequences with which the MR data for the individual slice images is acquired during the displacement of the object, structures in the slice image on the one hand and in an MR image derived from the first data set on the other hand could be reproduced with different contrast. In that case it would not be possible to determine the shift occurring between the acquisition of the first MR data set and the acquisition of the MR data for the slice image by comparison of the two images, so that the measured position of the object and/or the MR angiogram could no longer be corrected in conformity with the shift. In that case it is necessary to acquire a second MR data set in the temporal vicinity of the first data set. The comparability of the various images can be ensured by acquiring the second MR data set and the MR data for the various slices by means of similar excitation sequences.

A preferred version of the invention is characterized in that at least one microcoil is attached to the object in order to measure the position of the object, that a number of excitation sequences are generated for the acquisition of the MR data of the slice, the amplitude and/or direction of the magnetic gradient field active during the acquisition of the MR signal being varied from one sequence to another, and that the position of the object is derived from MR signals received by the microcoil in response to these sequences. The sequences generated according to this so-called projection reconstruction method enable at the same time the measurement of the position of the object by means of the microcoil connected thereto and the formation of an MR slice image by means of an additional receiving coil which picks up the MR signals then generated.

A device for carrying out the method according to the invention, including means for the acquisition of a first MR data set which represents the course of the vascular system within a three-dimensional volume and means for continuous measurement of the position of an object and its reproduction in an MR angiogram derived from the first MR data set is characterized in that it includes a) means for measuring the MR data of a slice, belonging at least partly to the volume and adapted to the position of the object, in the temporal vicinity of a measurement of the position of the object, b) means for reconstructing a slice image from this MR data, c) means for reconstructing an MR image of the same slice from the first data set or from a second MR data set which has been acquired in the temporal vicinity thereof and represents the three-dimensional volume, d) means for determining shifts, at least in a vicinity of the object, from the slice image and the MR image, e) means for correcting the measured position and/or the MR angiogram in conformity with the shifts and subsequent reproduction of the position of the object in the angiogram.

BRIEF DESCRIPTION OF THE DRAWINGS

The invention will be described in detail hereinafter with reference to the drawing. Therein.

DETAILED DESCRIPTION OF THE PREFERRED EMBODIMENTS

Figure 1:
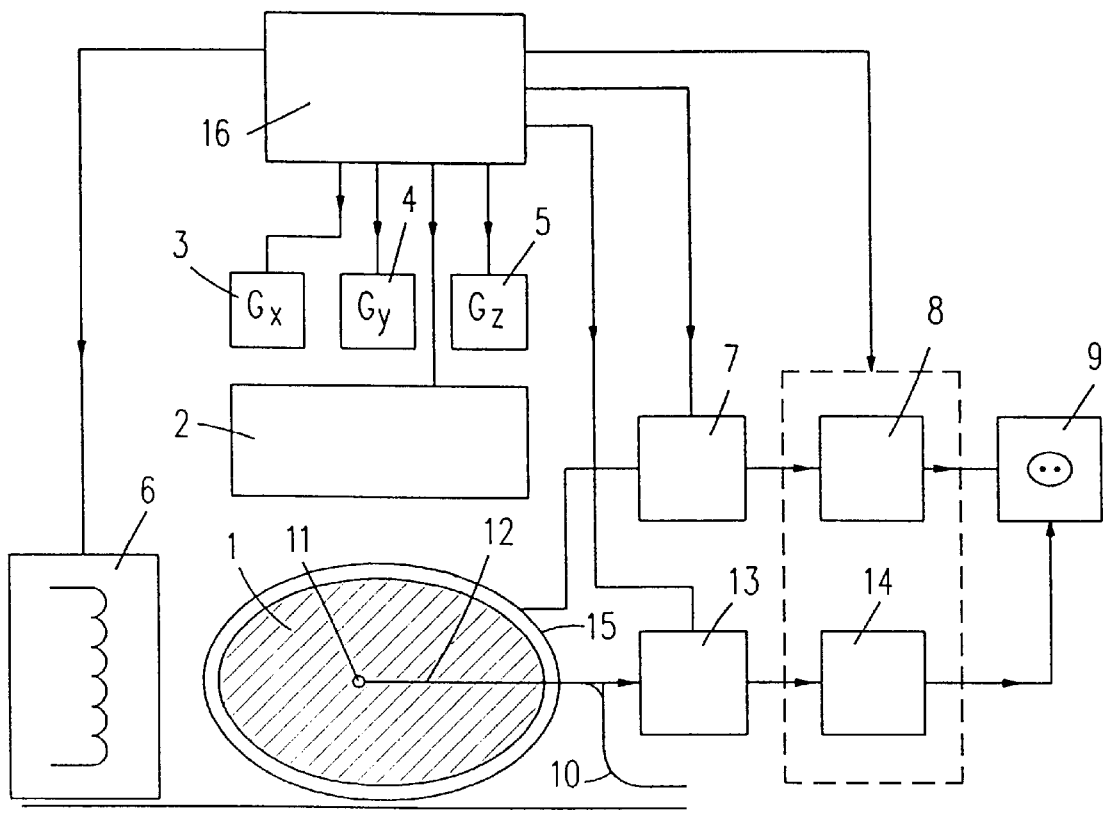
FIG. 1 shows an MR apparatus suitable for carrying out the method according to the invention.

The reference numeral 1 in FIG. 1 denotes an object to be examined, for example a patient. A catheter 10, whose position in relation to the vascular system of the patient should be monitored, has been introduced into the patient. A steady, uniform magnetic field having a strength of, for example 1.5 Tesla is generated in the examination zone, containing the patient, by means of a main field magnet 2. Three gradient coils 3, 4 and 5 generate magnetic fields which vary linearly in the x direction, the y direction and the z direction, respectively (therefore, they are also referred to as gradient fields hereinafter) and extend in the direction of the steady, uniform magnetic field.

There is also provided an RF transmitter coil 6 which is capable of generating RF pulses which cause an RF magnetic field extending perpendicularly to the steady magnetic field in the examination zone. The MR signals then arising in the examination zone or the object to be examined are received by an MR coil 15 and converted into MR data by a first MR receiver 7, the nuclear magnetization distribution in the examination zone being reconstructed from said MR data by means of a reconstruction unit 8. The distribution thus determined can be displayed by means of a display unit 9 (monitor).

The position of the catheter 10 can be determined in known manner by means of a microcoil 11 attached to the tip thereof, said microcoil being capable of picking up MR signals from a very small surrounding volume. A second MR receiver 13 converts these MR signals into MR data wherefrom the position of the microcoil, and hence the position of the tip of the catheter, can be determined in known manner by means of an arithmetic unit 14. This position can be reproduced in the MR image on the display unit 9 in known manner. The components 2–14 can be controlled by a control unit 16.

Figure 2:
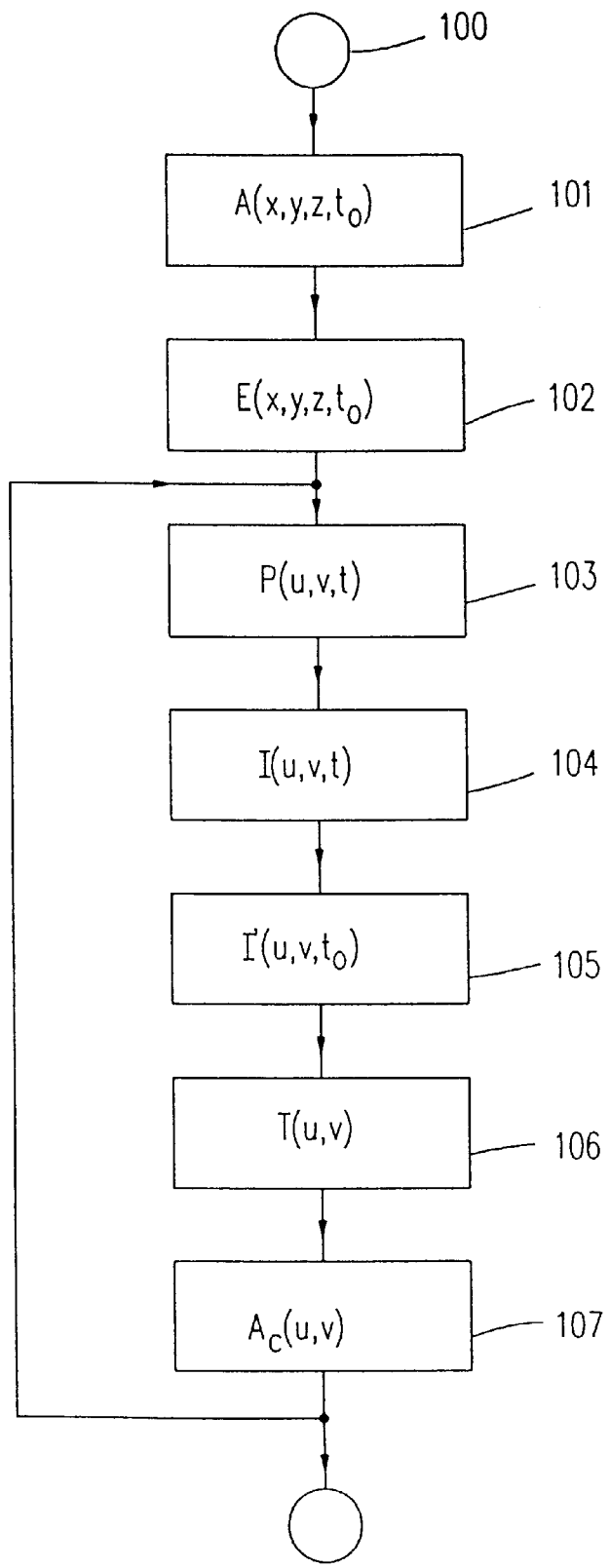
FIG. 2 shows a flow chart illustrating the method according to the invention.

The method carried out by means of the MR apparatus described with reference to FIG. 1 will be described in detail hereinafter on the basis of the flow chart of FIG. 2, the execution of said method being controlled in time by the control unit 16. Subsequent to the initialization in block 100, a first MR data set $A(x,y,z,t_0)$ is acquired, said set representing the course of the vascular system of the patient within a three-dimensional volume (block 101). This acquisition operation is preferably performed prior to the introduction of the catheter into the patient.

Figure 3:
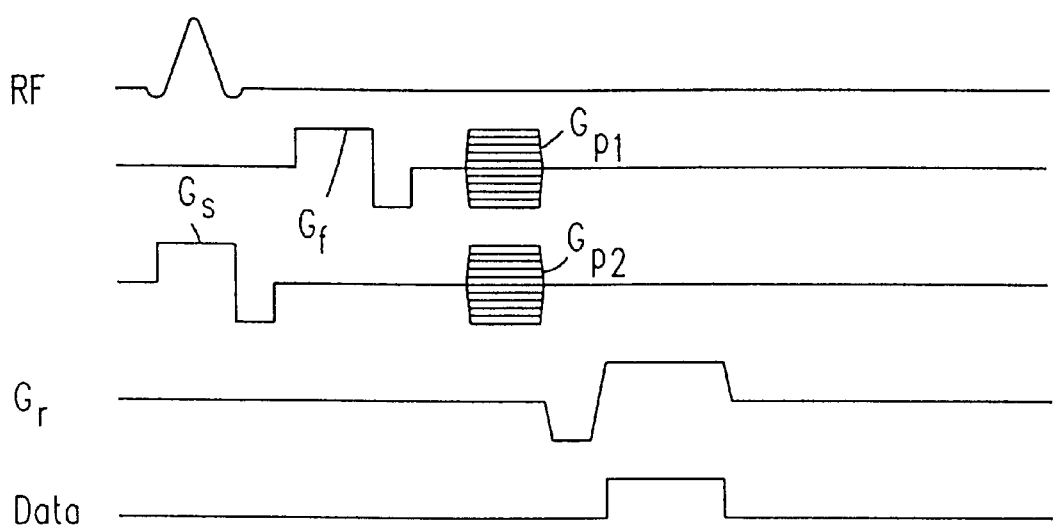
FIG. 3 shows the variation in time of various signals during the acquisition of the first MR data set.

FIG. 3 shows the variation in time of various signals in the case of an MR method which is suitable for these purposes and is known as a PCA (phase contrast angiography) method. The first line shows the position in time of an RF pulse and a simultaneous slice selection gradient $G_s$, (third line). The RF pulse is succeeded by two phase encoding gradients $G_{p1}$ and $G_{p2}$ (second and third lines) which can be generated by a respective one of the three gradient coil systems 3 . . . 5. Subsequently a read gradient $G_r$ is switched on and off (fourth line) and the MR signals then occurring are acquired by the phase-sensitive first MR receiver 7 (fifth line). The PCA method deviates from the known 3 DFT method in that additionally a flow encoding gradient $G_f$ is inserted, so that the blood flowing in the vascular system is given a phase code which is dependent on the direction and the flow velocity. Moreover, further groups of sequences are generated for which the flow encoding gradient extends in another one of the three spatial directions, and finally a further group is generated without any flow encoding. The acquisition of this first MR data set block 101 of FIG. 2 after an initialization step in block 100 requires a comparatively long period of time, that is to say from 8 to 25 minutes, depending on the number of phase encoding steps.

As can be read in the article by M. Kouwenhoven et al. "Current MR Angiography Imaging Techniques, A Survey" in the book "Vascular Diagnostics", edited by P. Lanser and J. Rösch, Springer Verlag, Heidelberg 1994, on the one hand the course of the vascular system can be reconstructed from this MR data set, without the anatomic structures otherwise present, whereas on the other hand the anatomic structures can be reproduced without the vascular system.

Subsequently, in block 102 a second MR data set E(x,y,z) which represents the nuclear magnetization distribution in the same volume as the first MR data set is acquired. The second data set must be acquired in the temporal vicinity of the first data set, for example immediately thereafter, in order to ensure that the further operation is not disturbed by motions having taken place in the examination zone between the acquisition of these data sets. The sequences used for the acquisition of this second MR data set should correspond, for example in respect of echo time and repetition time, to the sequences whereby the MR data for individual slices are acquired in the further course of the method. It is thus ensured that a slice image derived from this MR data and the image of the same slice which is derived from the second MR data set reproduce the anatomic structures with the same contrast ratio, so that the shifts which have meanwhile taken place in the examination zone can be determined by comparison of the images. If the first MR data set (or a subsidiary data set contained therein) already satisfies this condition, the acquisition of the second MR data set (step 102) can be omitted.

The steps 101 and 102, if any, are executed before introduction of the object to be imaged, i.e. the catheter, into the patient. All subsequent steps are executed only after introduction of the catheter. After introduction of the catheter, on the one hand its position P(u,v,t) is measured during step 103, and on the other hand in step 104 the MR data is acquired for a slice in which the catheter is present at that instant. The steps 103 and 104 can be performed independently of one another, but should be executed in the temporal vicinity of one another so that the imaging of the slice image and the MR measurement always take place in the same position of the catheter 10.

Figure 4:
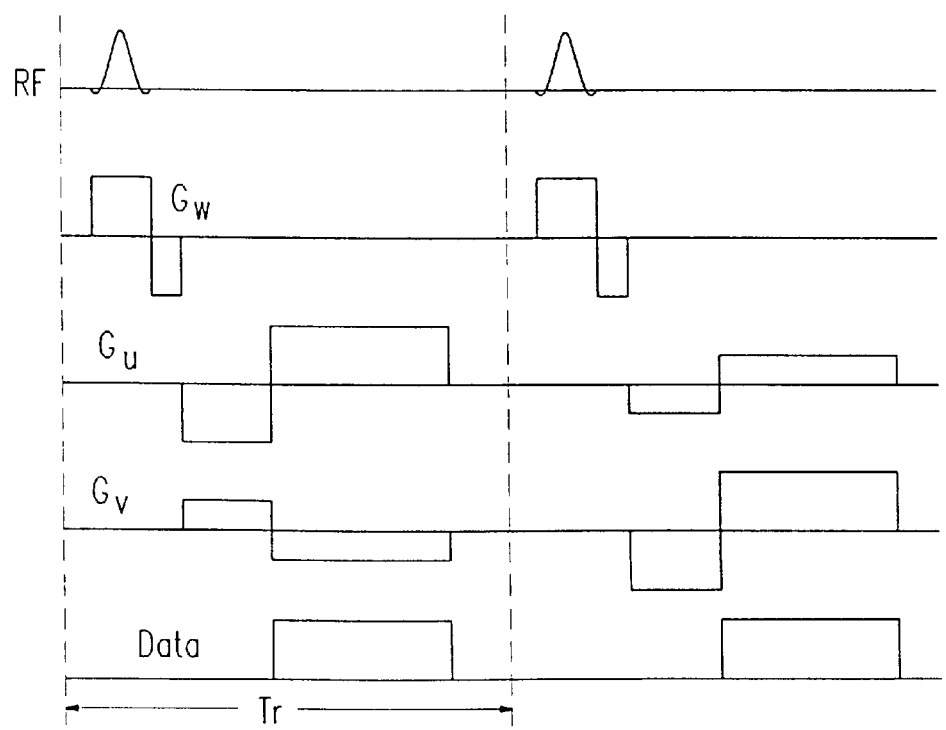
FIG. 4 shows the variation time of various signals during the acquisition of the MR data for a slice.

FIG. 4 shows two sequences whereby the MR signals are induced on the one hand into the microcoil 11 and on the other hand into the receiver coil 15, so that the position measurement takes place quasi simultaneously with the acquisition of the MR data for a slice image. In conformity with FIG. 4, an RF pulse (first line of FIG. 4) is generated in conjunction with a slice selection gradient $G_w$, with the result that the nuclear magnetization is excited in a slice which contains the catheter 10 and extends perpendicularly to the w direction. The w direction may coincide with one of the directions x, y or z in which the magnetic fields generated by the gradient coils 3 . . . 5 have a gradient; however, w may also extend obliquely with respect to the x, y, z co-ordinate system. Subsequent to the slice selective RF pulse, two magnetic gradient fields $G_u$ and $G_v$ are generated in the directions u and v (third and fourth lines of FIG. 4) which extend perpendicularly to one another and to the w direction, the MR signals then being received (fifth line) while the gradients $G_u$ and $G_v$ are still active. This sequence is repeated with a repetition time $T_r$, the gradients $G_u$ and $G_v$ being varied from one sequence to another in such a manner that the amount of the resultant gradient field remains constant whereas a direction is varied from one sequence to another.

Because of the frequency encoding by the gradients $G_u$ and $G_v$, for these sequences the microcoil 11 provides MR signals whose frequency characterizes the position of the microcoil in the respective active gradient direction. Therefore, on the basis of two of these sequences, preferably comprising 90° offset read gradients, the position P(u,v,t) of the microcoil within the slice can be determined and, via an additional measurement (with a gradient extending in the w direction) also its distance from the slice (block 103). The position of the microcoil, however, can also be determined by means of other MR sequences or completely different methods, for example the methods disclosed in the publication cited in the preamble.

Using the so-called projection reconstruction method, the nuclear magnetization within the slice can be reconstructed from the MR signals received by the receiver coil 15 during the sequences shown in FIG. 4 (step 104). The slice image I(u,v,t) reconstructed by means of the MR data derived from the MR signals reproduces the anatomic structures within the slice at the instant t at which the MR signals were acquired. The sequences shown in FIG. 4 can thus be used at the same time for the acquisition of the MR data of a slice image and for the measurement of the position of the catheter 10.

Figure 5:
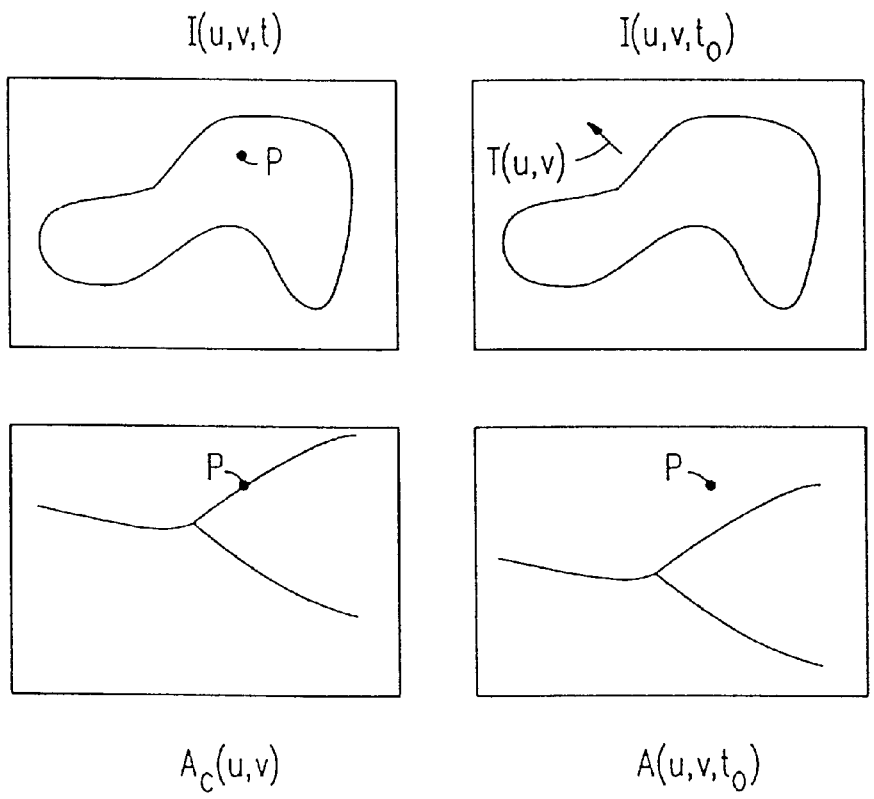
FIG. 5 shows various images derived from the MR data set or the MR data.

FIG. 5 shows the slice image I(u,v,t) in which the anatomic structure present in the slice examined is reproduced. The position P of the tip of the catheter, which has been measured simultaneously with the MR data of the slice, is also reproduced in the image I(u,v,t).

The reference $A(u,v,t_0)$ in FIG. 5 represents an angiogram which has been derived from the first data set $A(x,y,z,t_0)$, acquired at the instant $t_0$, and which shows the vascular system, for example in the same slice, whose anatomy or morphology is contained in the slice image I (u,v,t). The position of the catheter tip is also reproduced in this image and it appears that this position does not coincide with a vessel. A possible cause can be found in motions of the patient in the period of time elapsing between the acquisition of the first MR data set and the relevant measurement of the position P.

For a quantitative determination of these motions, in step 105 an MR image I' $(u,v,t_0)$ as a reference image is reconstructed from the second MR data set $E(x,y,z,t_0)$ or, if the sequences for the first MR data set reproduce the anatomic structures with the same contrast ratio as the sequences whereby the MR data for the slice image I(u,v,t) are reproduced, from the first MR data set $A(x,y,z,t_0)$. The image I' $(u,v,t_0)$ also being shown in FIG. 5, deviates from the MR slice image I(u,v,t) in that the MR data required for this image were acquired at the instant $t_0$, whereas the acquisition of the MR data for the slice image I(u,v,t), and the measurement of the position P, took place at the instant t. Therefore, the shift T(u,v) having occurred in the period of time $t_0$-t can thus be determined by comparison of these two images.

This operation is performed in step 106. To this end, one of the two images I(u,v,t) or I'(u,v,t) is subdivided into a number of, for example square areas (having a side length of, for example 100 pixels) and in the respective other image always that image area is determined, within a search region around the position of this area, which shows the best correspondence with the relevant image area in the one image. The shift T(u,v) can be determined from the position of these corresponding image areas. This is represented by the arrow T(u,v) in the image I'(u,v,t), it being assumed for the sake of simplicity that the shift is the same in all areas of the image (pure translation).

After the shift T(u,v) has thus been determined in the step 106, either the position P in the angiogram or the MR angiogram itself can be corrected. The reference $A_c(u,v)$ in FIG. 5 represents a correspondingly corrected angiogram in which the position P is reproduced in non-corrected form.

The advantage of correction of the MR angiogram resides in the fact that the vascular system is reproduced at least substantially in its state at the instant t of measurement of the position P of the catheter tip. It is a drawback, however, that a comparatively large amount of calculation work is required. This is because the position of each pixel in the angiogram must be corrected and the shift may vary within the image in a location-dependent manner. When the angiogram itself is left unchanged and merely the position of the catheter tip, corrected in conformity with the shift T, is reproduced in the angiogram, far less calculation work will be required, because the shift need only be determined for the image area corresponding to the position P of the catheter tip. However, in that case the vascular system is shown in the position it originally occupied and not in its instantaneous position.

When the loop formed by the steps 103 . . . 107 is continuously executed, the position of the catheter tip is continuously measured, the relevant shift with respect to the original situation is determined, and the angiogram, or the measured position, is corrected accordingly. In order to accentuate the position in the angiogram, for example the position can be reproduced in the angiogram $A_c(u,v)$ as a flashing spot or the like, it also being possible to reproduce the previously measured positions so that the catheter is reproduced over a larger part of its length.

It would in principle be possible to reproduce the anatomic structures from the slice images together with the vascular system, thus facilitating the orientation. The most important reason for the acquisition of these MR slice images, however, is the continuous determination of the shift (deformation) with respect to the original situation and to correct the angiogram or the measured catheter position accordingly.

All references cited herein, as well as the priority document German Patent Application 19701036.9 filed Jan. 15, 1997, are incorporated herein by reference in their entirety and for all purposes to the same extent as if each individual publication or patent or patent application was specifically and individually indicated to be incorporated by reference in its entirety for all purposes.

What is claimed is:

1. An MR method for the image-assisted monitoring of the displacement of an object relative to a vascular system comprising:
   acquiring a first MR data set ($A(x,y,z;t_0)$) which represents the course of the vascular system within a three-dimensional volume, and deriving therefrom one or more MR angiograms representing the vascular system,
   acquiring a second MR data set ($E(x,y,z;t_0)$) in the temporal vicinity of the first MR dataset and which also represents the three-dimensional volume, measuring the position (P(u,v,t)) of the object, acquiring MR data of a slice which belongs at least partly to the volume and is adapted to the position of the object, said acquiring taking place in the temporal vicinity of a measurement of the position (P(u,v,t)) of the object, reconstructing a slice image (I(u,v,t)) from the acquired MR slice data, reconstructing a reference MR image (I'(u,v,$t_0$)) of the same slice from the first data set (A(x,y,z;$t_0$)) or from the second MR data set (E(x,y,z;$t_0$)) (which has been acquired in the temporal vicinity thereof and represents the three-dimensional volume, determining shifts (T(u,v)), at least in the vicinity of the object, from comparison of the slice image and the reference MR image, correcting the measured position of the object with respect to the derived MR angiogram in conformity with the determined shifts (T(u,v,t)) so that the object can be reproduced in a correct position relative to the vascular system, reproducing the corrected position of the object with respect to the derived MR angiogram, and repeating the steps of measuring, acquiring MR data of a slice, reconstructing a slice image, reconstructing a reference image, determining, correcting and reproducing for other positions of the object.

2. An MR method as claimed in claim 1 wherein the step of acquiring the second MR data set and the step of acquiring MR data of a slice are performed by means of similar excitation sequences.

3. An MR method as claimed in claim 1 wherein the step of measuring the position of the object further comprises determining the position from MR signals received by at least one microcoil attached to the object, and wherein the step of acquiring MR data of a slice further comprises generating a number of excitation sequences, wherein the amplitude and/or direction of the magnetic gradient field ($G_u$, $G_v$) active during the excitation sequences are varied from one sequence to another, and MR signals are received by the microcoil in response to some of these sequences.

4. A device for the image-assisted monitoring of the displacement of an object relative to a vascular system comprising:

means for the acquisition of a first MR data set (A(x,y,z;$t_0$)) which represents the course of the vascular system within a three-dimensional volume and for deriving therefrom one or more MR angiograms representing the vascular system, means for the acquisition of a second MR data set (E(x,y,z;$t_0$)) in the temporal vicinity of the first MR dataset and which also represents the three-dimensional volume, means for measurement of the position (P(u,v,t)) of an object means for measuring the MR data of a slice, belonging at least partly to the volume and adapted to the position of the object, in the temporal vicinity of a measurement of the position of the object, means for reconstructing a slice image (I(u,v,t)) from the measured MR slice data, means for reconstructing a reference MR image (I'(u,v,t)) of the same slice from the first data set (A(x,y,z;$t_0$)) or from the second MR data set (E(x,y,z;$t_0$))

means for determining shifts, at least in the vicinity of the object, from comparison of the slice image (I(u,v,t)) and the reference MR image (I'(u,v,$t_0$)), means for correcting the measured position of the object with respect to the derived MR angiogram in conformity with the determined shifts so that the object can be reproduced in a correct position relative to the vascular system, means for the reproduction of the corrected position of the object with respect to the derived MR angiogram ($A_c$(u,v)).

5. The method of claim 1 wherein the step of correcting further comprises correcting only the measured position of the object in conformity with the determined shifts, and wherein the step of reproducing further comprises reproducing the corrected position of the object in the derived MR angiogram.

6. The method of claim 1 wherein the step of correcting further comprises correcting only the derived MR angiogram in conformity with the determined shifts, and wherein the step of reproducing further comprises reproducing the measured position of the object in the corrected MR angiogram.

7. The method of claim 1 wherein the derived MR angiogram represents the vascular system in the same slice as is represented in the reconstructed slice image.

8. An MR method for the image-assisted monitoring of the displacement of an object relative to a vascular system comprising:

acquiring a first MR data set (A(x,y,z;$t_0$)) which represents the course of the vascular system within a three-dimensional volume, and deriving therefrom one or more MR angiograms representing the vascular system, measuring the position (P(u,v,t)) of the object, acquiring MR data of a slice which belongs at least partly to the volume and is adapted to the position of the object, said acquiring taking place in the temporal vicinity of a measurement of the position (P(u,v,t)) of the object, reconstructing a slice image (I(u,v,t)) from the acquired MR slice data, reconstructing a reference MR image (I'(u,v,$t_0$)) of the same slice from the first data set (A(x,y,z;$t_0$)), determining shifts (T(u,v)), at least in the vicinity of the object, from comparison of the slice image and the reference MR image, correcting the measured position of the object with respect to the derived MR angiogram in conformity with the shifts (T(u,v,t)) so that the object can be reproduced in a correct position relative to the vascular system, reproducing the corrected position of the object with respect to the derived MR angiogram, and repeating the steps of measuring, acquiring MR data of a slice, reconstructing a slice image, reconstructing a reference image, determining, correcting, and reproducing for other positions of the object.

* * * * *